US005838019A

United States Patent [19]

Tsukamoto et al.

[11] Patent Number: 5,838,019

[45] Date of Patent: Nov. 17, 1998

[54] ELECTRON EMITTING ELEMENT

[75] Inventors: Takeo Tsukamoto, Atsugi; Akira Shimizu, Sagamihara; Akira Suzuki; Masao Sugata, both of Yokohama; Isamu Shimoda, Zama; Masahiko Okunuki, Nishi Tama-gun, all of Japan

[73] Assignee: Canon Kabushiki Kaisha, Tokyo, Japan

[21] Appl. No.: 415,587

[22] Filed: Apr. 3, 1995

Related U.S. Application Data

[63] Continuation of Ser. No. 266,798, Jun. 28, 1994, abandoned, which is a continuation of Ser. No. 917,532, Jul. 20, 1992, abandoned, which is a continuation of Ser. No. 602,937, Oct. 24, 1990, abandoned, which is a continuation of Ser. No. 498,494, Mar. 26, 1990, abandoned, which is a continuation of Ser. No. 366,214, Jun. 15, 1989, abandoned, which is a continuation of Ser. No. 256,255, Oct. 4, 1988, abandoned, which is a continuation of Ser. No. 49,401, May 14, 1987, abandoned.

[30] Foreign Application Priority Data

May 8, 1986 [JP] Japan .................................. 61-113520

[51] Int. Cl.[6] ..................................................... H01L 29/12

[52] U.S. Cl. ......................... 257/10; 313/346 R; 313/446

[58] Field of Search ................................ 313/346 R, 366, 313/446; 357/15, 30, 31, 13, 4; 257/10

[56] References Cited

U.S. PATENT DOCUMENTS

| | | | |
|---|---|---|---|
| 3,334,248 | 8/1967 | Stratton | 357/15 |
| 3,581,151 | 5/1971 | Bogle et al. | 357/4 |
| 3,958,143 | 5/1976 | Bell | 357/16 |
| 4,682,074 | 7/1987 | Hoeberechts et al. | 313/446 |

OTHER PUBLICATIONS

Stolte, C.A., et al., "pn–Schottky Hybrid Cold–Cathode," Applied Physics Letters, vol. 19, No. 11, Dec. 1971, pp. 497–498.

Stupp, E., et al., "GaP Negative–Electron–Affinity Cold Cathodes: a Demonstration and Appraisal," Journal of Applied Physics, vol. 48, Nov. 1977, pp. 4741–4748.

*Primary Examiner*—John Guay
*Attorney, Agent, or Firm*—Fitzpatrick, Cella, Harper & Scinto

[57] ABSTRACT

An electron emitting device is provided with an N type semiconductor disposed in contact with a first electrode. A P type semiconductor contacts the N type semiconductor to define a PN junction. A low work function metal electrode contacts the P type semiconductor thus defining a Schottky barrier. First and second means are provided to forward bias the PN junction and to reversed bias the Schottky barrier, respectively.

5 Claims, 4 Drawing Sheets

ELECTRON EMITTING ELEMENT

This application is a continuation of application Ser. No. 08/266,798 filed Jun. 28, 1994 ; which is a continuation of application Ser. No. 07/917,532 filed Jul. 20, 1992, which is a continuation of application Ser. No. 07/602,937 filed Oct. 24, 1990, which is a continuation of application Ser. No. 07/498,494 filed Mar. 26, 1990, which is a continuation of application Ser. No. 07/366,214 filed Jun. 15, 1989, which is a continuation of application Ser. No. 07/256,255 filed Oct. 4, 1988, which is a continuation of application Ser. No. 07/049,401 filed May 14, 1987, all now abandoned.

BACKGROUND OF THE INVENTION

1. Field of the Invention

This invention relates to an electron emitting element and more particularly to an electron emitting element which emits electrons injected into a P type semiconductor thereof by using a negative electron affinity (NEA) state.

2. Related Background Art

FIG. 1 illustrates energy bands at a metal-semiconductor junction. As shown, in order to accomplish an NEA state, in which the vacuum level Evac is lower than the level of the conduction band Ec of a P-type semiconductor, it is necessary to form a material on the semiconductor surface which will reduce the work function ϕm. A typical work function reducing material is an alkali metal, and especially, Cs or Cs-O. If the work function ϕm at the surface of the semiconductor is low, and the element is at an NEA state, electrons injected into the P type semiconductor are easily emitted. Thus an electron emitting element can be obtained which has a large electron emission efficiency.

However, the metal materials of conventional electron emitting elements have a narrow selective range to satisfy the above conditions, so that it is difficult to easily form elements having stable characteristics.

SUMMARY OF THE INVENTION

It is therefore an object of this invention to provide an electron emitting element which solves the above problems, broadens a range of selected materials and easily accomplishes a stable electron emitting characteristic.

FIG. 2 illustrates energy bands at a semiconductor surface in this invention. As will be obvious from this figure, by backwardly biasing the junction between a P type semiconductor and a work function reducing material, the vacuum level Evac can be lower than the level of the conduction band Ec of the P type semiconductor to easily obtain a larger energy difference ΔE than the conventional one. Therefore, the use of a chemically stable metal material having a relatively large work function ϕm easily results in an NEA state although in the equilibrium state the vacuum level Evac is higher than the level of the condution band Ec of the P type semiconductor. Thus, stabilized characteristics and improved electron emission efficiency are achieved.

DETAILED DESCRIPTION OF THE PREFERRED EMBODIMENTS

Embodiments of this invention will now be described in detail with regard to Si as an example with reference to the drawings. It should be noted that the semiconductor material for use in the present invention should not be limited to only Si.

Figure 1:
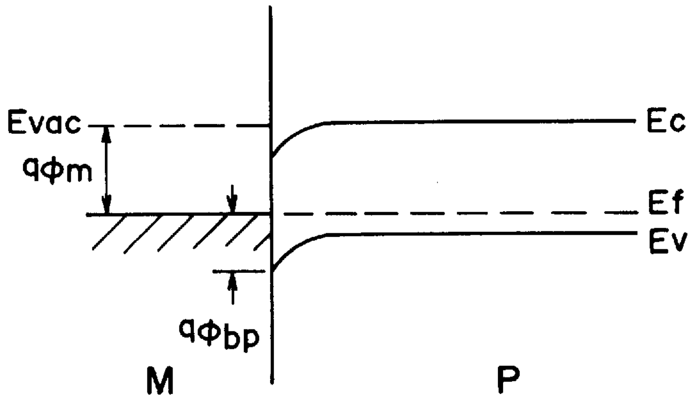
FIG. 1 is a diagram of energy bands at the metal-semiconductor junction.
Figure 2:
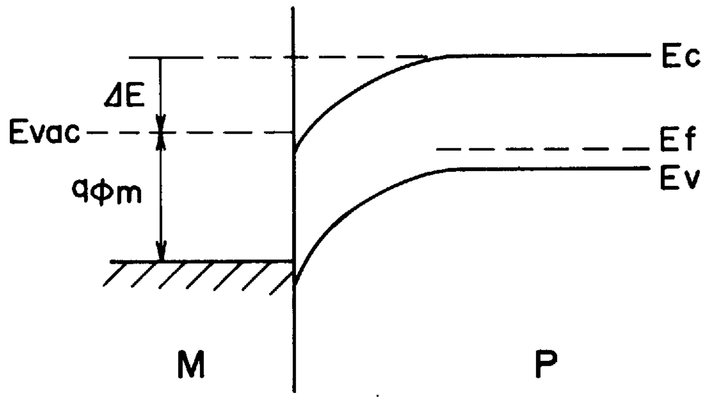
FIG. 2 is a graph of energy bands at the semiconductor surface according to an embodiment of this invention.
Figure 3:
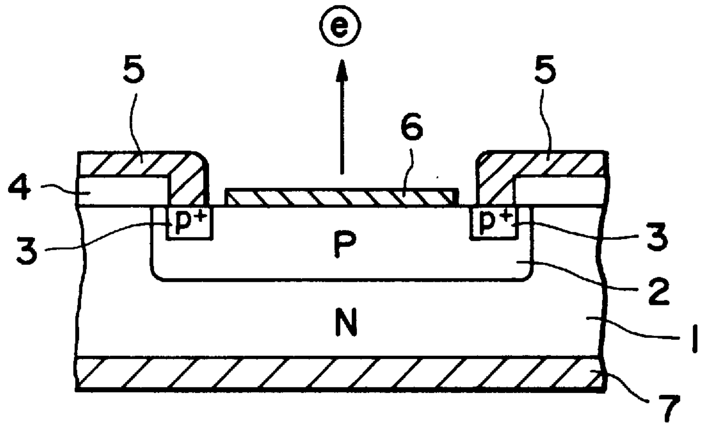
FIG. 3 is a schematic cross-sectional view showing the structure of a first embodiment of an electron emitting element according to this invention.
Figure 4:
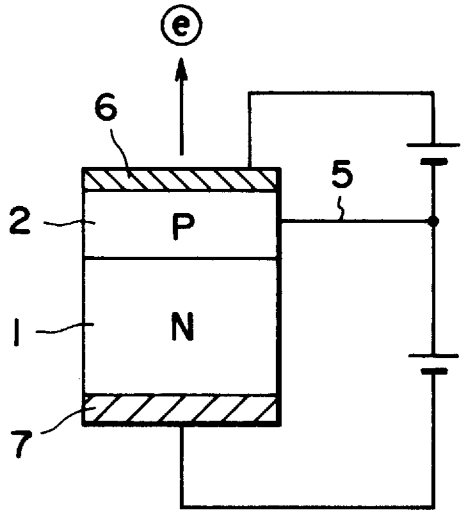
FIG. 4 illustrates the operation of this embodiment.

FIG. 3 is a schematic cross-sectional view showing the structure of a first embodiment of an electron emitting element according to this invention. FIG. 4 illustrates the operation of this embodiment. In FIG. 3, an insulating layer 4 is formed on an N-type Si (100) substrate 1. An opening is then provided to form a P-type layer 2 by photolithography or the like. Subsequently, the P-type layer 2 is formed by diffusing impurities or the like, and ohmic contacts $P^+$-type layer 3 by injecting ions into the P-type layer 2 formed. Electrodes 5 of Al or the like and a metal electrode 6 to be described later are then formed. Finally, an electrode 7 is formed on the opposite side of substrate 1 through the ohmic contact layer.

Most of the semiconductor materials other than Si as described in the above embodiment can also be used in the electron emitting element of the present invention. It is preferable that the semiconductor for use is an indirect transition type and P type one, more preferably one having wider band gap Eg since such wider band gap one has more greater electron emitting efficiency. The P type semiconductors for use in the present invention are, for example, Ge, GaAs, GaP, GaAlP, GaAsP, GaAlAs, SiC, BP and etc. As the low work function material for producing the metallic electrode 6, a material which possesses clear Schottky characteristics is desirably used.

In general, there is a linear relation between the work function $\phi_{WK}$ and Schottky barrier height $\phi_{Bn}$ to N type semiconductor (see Sze: Physics of Semiconductor Devices second Edition, P. 274, FIG. 16; Wiley-Interscience).

The relation for Si is explained as:

$$\phi_{BN}=0.235\phi_{WK}-0.55.$$

Like to other semiconductor materials, as the work function grows smaller, the $\phi_{BN}$ is lowered. And, in general, the relation between the Schottky barrier heights $\phi_{BP}$ and $\phi_{BN}$ respectively to P type and n type semiconductors is expressed as follows:

$$\phi_{BN}+\phi_{BP}=1/q\ Eg$$

Therefore, the Schottky barrier height $\phi_{BP}$ to P type semiconductor is expressed as follows:

$$\phi_{BP}=1/q\ Eg-\phi_{BN}$$

Accordingly, by using low work function material, desirable Schottky diode to P type semiconductor can be produced. In the present invention, as a low work function material forming the metal electrode 6, metals of groups 1A, 2A, 3A, 4A and elements of the lanthanide series, and silicides, boromides and carbides of materials of groups 1A, 2A, 3A, 4A and lanthanide series elements, are used.

Preferable materials are concretely Mg, Sc, La, $CsSi_2$, $BaSi_2$, $GdSi_2$, $TiSi_2$, $BaB_6$, $CaB_6$, $GdB_6$, TiC, ZrC, HfC, and etc.

Work functions of these materials are approximately 2.5–4 eV. They would be preferable materials for forming Schottky barrier to P type semiconductor. Thus, according to the present invention, since the electron emission is achieved by applying reverse bias to a junction formed between the P type semiconductor 2 and the metal electrode 6, materials with relatively large work function which can not be used in prior art can also be used as the material of the metal electrode 6. Needless to say, conventionally used material, concretely, metals such as Li, Na, K, Rb, Sr, Cs, Ba, Eu, Yb, Fr, and etc., and alkali metal suicides such as CsSi, RbSi, and etc. with low work function, for example, less than 2.5 eV can also be used in the present invention.

Thus, when material with work function less than 2.5 eV is selected for use, it is preferable that the lower limit of the work function is designed as 1.5 eV. The reason why in this embodiment the surface (100) of Si substrate 1 is used is that in the case of the surface (100) the electron affinity of silicon is low to thereby facilitate the emission of electrons.

Figure 5A:
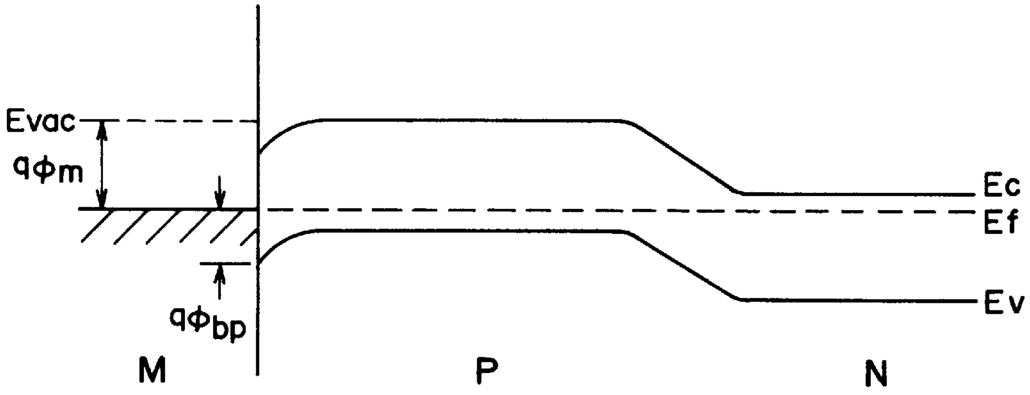
FIG. 5A illustrates energy bands at an equilibrium state of this embodiment.
Figure 5B:
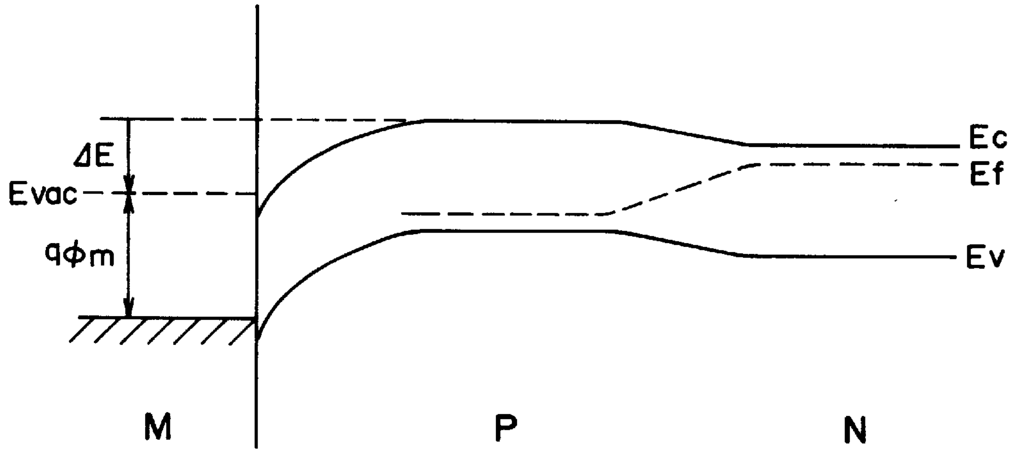
FIG. 5B illustrates the energy bands of the embodiment in operation.

Application of a bias voltage to an element having such structure, as shown in FIG. 4, causes electrons to be emitted from the metal electrode 6 surface. Now, this operation will be described. FIG. 5A illustrates energy bands at the equilibrium of this embodiment. FIG. 5B illustrates energy bands at the operation of this embodiment.

As shown in FIG. 4, when a forward bias voltage is applied across the PN junction and a backward bias voltage is applied across the P layer 2 and metal electrode 6, the energy bands change to result in an NEA state, as shown in FIG. 5B, wherein as shown before the vacuum level Evac is ΔE is lower than the level of the conduction band Ec of P layer 2. Therefore, the electrons injected from N type substrate 1 to P layer 2 are emitted from the surface of metal electrode 6 to thereby provide a larger electron emission efficiency because the ΔE is larger than the conventional one.

Since the backward bias increases the ΔE, the metal material is not limited to Cs or Cs-O having a small work function as in the prior art, and it is possible to select from a wider range of alkali metals, as mentioned above, and from alkali earth metals to thereby permit the use of a more stable material.

Figure 6:
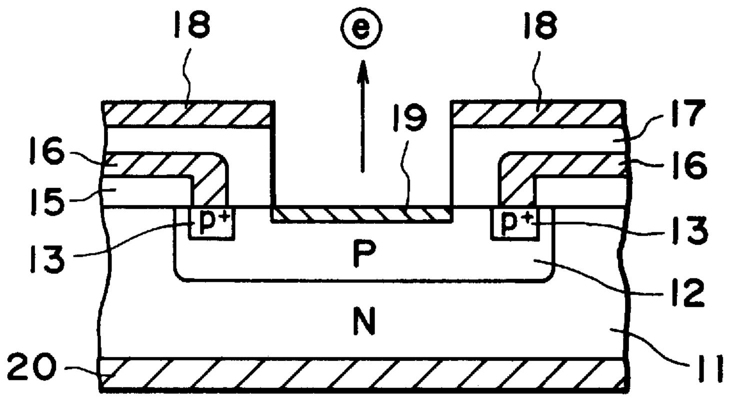
FIG. 6 is a schematic cross-sectional view showing the structure of a second embodiment of an electron emitting element according to this invention.
Figure 7:
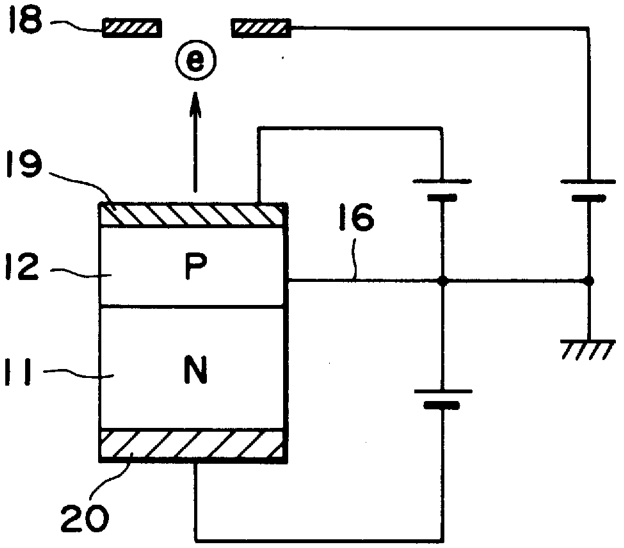
FIG. 7 illustrates the operation of the second embodiment.

FIG. 6 is a schematic cross-sectional view showing the structure of a second embodiment of an electron emitting element according to this invention. FIG. 7 illustrates the operation of the second embodiment. In FIG. 6, an insulating layer 15 is formed on a surface on N type Si (100) substrate 11. An opening is then provided to form P layer 12 by photolithography or the like. Subsequently, P layer 12 is formed by impurity diffusion etc. An ohmic contact $P^+$ layer 13 is then formed by injecting ions into P layer 12.

Electrodes 16, connected to $P^+$ layer, etc., are then formed on insulating layer 15 on which are formed an insulating layer 17 and a metal layer. Thereafter, insulating layer 17 and the metal layer at the electron emission section are eliminated to form leading electrodes 18. A metal electrode 19 of a low work function material is then formed in P layer 12 using electrodes 18 and insulating layer 17 as masks. In this embodiment, an alkali metal silicide (for example, CsSi, RbSi or the like) stable as a metal electrode 19 material was used. Metal material 19 of CsSi can easily be formed by depositing Cs onto the P layer 12 surface of the electron emission section and treating the resulting product thermally. Finally, an electrode 20 is formed on the opposite side substrate 11 through the ohmic contact layer.

Application of a bias voltage to such element, as shown in FIG. 7, causes electrons to be emitted from the surface of metal electrode 19. This operation will briefly be described. Application of a backward bias across electrode 16 and metal electrode 19 results in an NEA state in which the vacuum level Evac is lower than the level of the conduction band Ec of P layer 12, as described above. A positive voltage is further applied to leading electrode 18 in this embodiment, so that the work function is lowered due to Schottky effect to thereby emit a larger amount of electrons.

As described above in detail, in an electron emitting element of each of the above embodiments, application of a backward bias across the junction between P type semiconductor and a work function reducing material causes the vacuum level Evac to become lower than the level of the conduction band Ec of the P type semiconductor, thereby providing an energy difference ΔE larger than the conventional one. Therefore, an NEA state can easily be obtained using a stable metal material having a work function ϕm which becomes larger although at the equilibrium the vacuum level Evac may be higher than the level of the condition band Ec of P type semiconductor. Thus a metal material can be selected in a range wider than the conventional one and the use of a stable metal material serves to attain a higher electron emission efficiency.

We claim:

1. An electron emitting device comprising:

a P-type semiconductor;

an N-type semiconductor, arranged adjacent to said P-type semiconductor, wherein said N-type semiconductor and said P-type semiconductor form a PN junction;

a first electrode electrically connected to said N-type semiconductor;

a second electrode connected electrically to said P-type semiconductor;

a low work function metal electrode arranged in contact with said P-type semiconductor, and forming a Schottky barrier between said low work function metal and said P-type semiconductor;

first means for applying a forward bias through said first and second electrodes to said PN junction; and second means for applying to said Schottky barrier a reverse bias lowering a vacuum level below a level of a conduction band of said P-type semiconductor.

2. An electron emitting device according to claim 1, wherein said P type semiconductor comprises a material selected from the group consisting of Si, Ge, GaAs, GaP, GaALP, GaAsP, GaAlAs, SiC and BP, and wherein said low work function metal electrode is joined to a surface of said P type semiconductor having a low electron affinity.

3. An electron emitting device according to claim 1, wherein said second means reversely biases the Schottky barrier such that the vacuum level $E_{vac}$ is lower than the level of the conduction band $E_c$ of the p-type semiconductor, whereby a negative electron affinity state results.

4. An electron emitting device according to claim 1, wherein said low work function metal electrode is formed from a material selected from the group consisting of Group Ia, Group IIa, Group IIIa and the lanthanide series, silicide of the metal, boride of the metal and carbide of the metal.

5. An electron emitting device according to claim 1, wherein said P-type semiconductor comprises a material which causes a negative electron affinity in a region at a side of said low work function metal electrode without changing an energy bandgap state in a region at a side of said N-type semiconductor when the reverse bias is applied by said second means.

* * * * *

UNITED STATES PATENT AND TRADEMARK OFFICE
CERTIFICATE OF CORRECTION

PATENT NO. : 5,838,019

DATED : November 17, 1998

INVENTOR(S) : TAKEO TSUKAMOTO ET AL.

It is certified that error appears in the above-identified patent and that said Letters Patent is hereby corrected as shown below:

ON THE TITLE PAGE:

AT [56], REFERENCES CITED, OTHER PUBLICATIONS

In "Stolte, C.A.," , "Cold-Cathode," should read --Cold-Cathode Diode,--.

In "Stupp, E.," , "vol. 48," should read --vol. 48, No. 11,--.

AT [30], FOREIGN APPLICATION PRIORITY DATA,

"May 8, 1986" should read --May 20, 1986--.

COLUMN 1

Line 18, "P type" should read --P-type--.
Line 29, "P type" should read --P-type--.
Line 45, "P type" should read --P-type--.
Line 48, "P type semiconductor" should read --P-type semiconductor,--.
Line 52, "condution" should read --conduction--.
Line 60, "semicondutor" should read --semiconductor--.

UNITED STATES PATENT AND TRADEMARK OFFICE
CERTIFICATE OF CORRECTION

PATENT NO. : 5,838,019

DATED : November 17, 1998

INVENTOR(S) : TAKEO TSUKAMOTO ET AL.

It is certified that error appears in the above-identified patent and that said Letters Patent is hereby corrected as shown below:

COLUMN 2

Line 27, "of the" should be deleted.
Line 31, "P type" should read --P-type layer--.
Line 32, "more" should be deleted.
Line 33, "P type" should read --P-type--.
Line 35, "BP and" should read --BP,--.
Line 38, "desirably used." should read --preferable.--.
Line 40, "N type" should read --N-type--.
Line 46, "Like to" should read --As with--.
Line 49, "P type and n type" should read --P-type and N-type--.
Line 58, "using" should read --using a--; and "desir-" should read --a good--.
Line 59, "Able Schottky diode to P type" should read --Schottky diode with P-type--.
Line 64, "lanthanide series" should read --lanthanide-series--.

COLUMN 3

Line 2, "forming" should read --forming a--.
Line 3, "to P type" should read --with a P-type--.
Line 5, "P type" should read --P-type--.
Line 6, "can" should read --could--.
Line 7, "in" should read --in the--.
Line 10, "and etc.," should read --etc.,--; and "suicides" should read --silicides--.
Line 11, "and etc." should read --etc.,--.
Line 18, "low to" should read --low,--; and "facilitate" should read --facilitating--.
Line 21, "Now," should read --Now--.
Line 26, "P layer" should read --P-type layer--.

UNITED STATES PATENT AND TRADEMARK OFFICE

CERTIFICATE OF CORRECTION

PATENT NO. : 5,838,019

DATED : November 17, 1998

INVENTOR(S) : TAKEO TSUKAMOTO ET AL.

It is certified that error appears in the above-identified patent and that said Letters Patent is hereby corrected as shown below:

<u>COLUMN 3</u>

Line 29, "P" should read --P-type--.
Line 30, "N type" should read --N-type--.
Line 31, "P layer" should read --P-type layer--.
Line 44, "N type" should read --N-type--.
Line 45, "P layer" should read --P-type layer--.
Line 46, "P layer" should read --P-type layer--.
Line 47, "diffusion" should read --diffusion,--; and "$P^-$ layer," should read --$P^+$-type--.
Line 48, "P layer" should read --P-type layer--.
Line 49, "to $P^+$ layer," should read --to the $P^+$-type layer,--.
Line 54, "P layer" should read --P-type layer--.
Line 59, "P layer" should read --P-type layer--.

UNITED STATES PATENT AND TRADEMARK OFFICE

CERTIFICATE OF CORRECTION

PATENT NO. : 5,838,019

DATED : November 17, 1998

INVENTOR(S) : TAKEO TSUKAMOTO ET AL.

It is certified that error appears in the above-identified patent and that said Letters Patent is hereby corrected as shown below:

COLUMN 4

Line 3, "P layer" should read --P-type layer--.
Line 5, "to" should read --to the--; and "effect" should read --effect,--.
Line 8, "P type" (3 occurrences) should read --P-type layer--.
Line 11, "P type" (3 occurrences) should read --P-type layer--.
Line 18, "P type" (3 occurrences) should read --P-type layer.

Signed and Sealed this

Thirtieth Day of November, 1999

Attest:

Q. TODD DICKINSON

Attesting Officer

Acting Commissioner of Patents and Trademarks